(12) United States Patent
Cho et al.

(10) Patent No.: US 12,262,626 B2
(45) Date of Patent: Mar. 25, 2025

(54) THERMOSETTING LIQUID COMPOSITION FOR ENCAPSULANT IN ORGANIC LIGHT-EMITTING DEVICE

(71) Applicant: INNOX Advanced Materials Co., Ltd., Asan-si (KR)

(72) Inventors: Young Min Cho, Asan-si (KR); Jong Geol Lee, Asan-si (KR); Myung Sup Jung, Asan-si (KR)

(73) Assignee: INNOX ADVANCED MATERIALS CO., LTD., Asan-si (KR)

( * ) Notice: Subject to any disclaimer, the term of this patent is extended or adjusted under 35 U.S.C. 154(b) by 0 days.

(21) Appl. No.: 17/881,685

(22) Filed: Aug. 5, 2022

(65) Prior Publication Data

US 2023/0054116 A1    Feb. 23, 2023

(30) Foreign Application Priority Data

Aug. 6, 2021  (KR) .................. 10-2021-0103653

(51) Int. Cl.
| | | |
|---|---|---|
| *H10K 85/10* | (2023.01) | |
| *C08G 59/38* | (2006.01) | |
| *C08G 59/50* | (2006.01) | |
| *H10K 50/844* | (2023.01) | |

(52) U.S. Cl.
CPC ............ *H10K 85/111* (2023.02); *C08G 59/38* (2013.01); *C08G 59/50* (2013.01); *H10K 50/844* (2023.02)

(58) Field of Classification Search
CPC .. H10K 85/111; H10K 50/844; H10K 50/846; H10K 50/8426; C08G 59/38; C08G 59/50; C08G 59/32; C08G 59/686; C08G 59/688
See application file for complete search history.

(56) References Cited

U.S. PATENT DOCUMENTS

| | | | | | |
|---|---|---|---|---|---|
| 7,638,163 B2* | 12/2009 | Murakami | ........... | G02B 5/0215 | |
| | | | | 427/164 | |
| 8,758,649 B2* | 6/2014 | James | .................... | C09D 11/52 | |
| | | | | 252/500 | |
| 2014/0367670 A1* | 12/2014 | Yamamoto | ............. | H10K 50/11 | |
| | | | | 523/400 | |
| 2016/0196892 A1* | 7/2016 | Ohori | ...................... | G06F 3/041 | |
| | | | | 345/173 | |
| 2019/0187335 A1* | 6/2019 | Nakayama | ............... | G02B 1/18 | |
| 2020/0127206 A1* | 4/2020 | Lee | ......................... | C08L 63/00 | |
| 2020/0176706 A1 | 6/2020 | Tomita et al. | | | |

FOREIGN PATENT DOCUMENTS

| | | | |
|---|---|---|---|
| CN | 103636286 A | 3/2014 | |
| JP | 2002348351 A | 12/2002 | |
| JP | 2010209151 A | 9/2010 | |
| JP | 2012121760 A | 6/2012 | |
| JP | 2013091676 A | 5/2013 | |
| JP | 2014037326 A | 2/2014 | |
| JP | 2016069475 A | 5/2016 | |
| JP | 2016079360 A | 5/2016 | |
| JP | 2018145430 A | 9/2018 | |
| JP | 2021141438 A | 9/2021 | |
| KR | 20170133312 A | 12/2017 | |
| KR | 20200115573 A | 10/2020 | |
| WO | 2007052710 A1 | 5/2007 | |
| WO | 2009069562 A1 | 6/2009 | |
| WO | 2011004873 A1 | 1/2011 | |
| WO | 2012020688 A1 | 2/2012 | |
| WO | 2013005441 A1 | 1/2013 | |
| WO | 2013118509 A1 | 8/2013 | |
| WO | 2015064410 A1 | 5/2015 | |
| WO | 2018230725 A1 | 12/2018 | |
| WO | 2019117298 A1 | 6/2019 | |
| WO | 2021067693 A1 | 4/2021 | |

OTHER PUBLICATIONS

English Translation of Korean Office Action for related application No. 10-2021-0103653, Apr. 3, 2024, 12 pages.
English Translation of Japanese Office Action for related application No. 2022-123753, Jun. 27, 2023, 15 pages.
Partial English Translation of Korean Written Description on Registration for related application No. 10-2021-0103653, Nov. 4, 2024, 9 pages.

* cited by examiner

*Primary Examiner* — Andrew J. Oyer
(74) *Attorney, Agent, or Firm* — Carter, DeLuca & Farrell LLP; Jeffrey S. Steen

(57) ABSTRACT

Disclosed is a liquid composition for an encapsulant of an organic light-emitting device. The liquid composition is free of a physical and chemical hygroscopic agent (getter) but includes a binder material having high hygroscopicity including an aliphatic 4-functionalized epoxy-based compound. Thus, the liquid composition for the encapsulant may be rapidly cured at low temperature and may secure excellent storage stability under a high temperature environment.

10 Claims, No Drawings

THERMOSETTING LIQUID COMPOSITION FOR ENCAPSULANT IN ORGANIC LIGHT-EMITTING DEVICE

CROSS-REFERENCE TO RELATED APPLICATION

This application claims priority from Korean Patent Application No. 10-2021-0103653 filed on Aug. 6, 2021 in the Korean Intellectual Property Office, and all the benefits accruing therefrom under 35 U.S.C. 119, the contents of which in its entirety are herein incorporated by reference.

BACKGROUND

Field

The present disclosure relates to a thermosetting liquid composition for an encapsulant in an organic light-emitting device. More specifically, the present disclosure relates to a thermosetting liquid composition for an encapsulant in an organic light-emitting device, wherein the composition is free of a physical or chemical hygroscopic agent (getter) but includes an epoxy binder material having high hygroscopicity.

Description of Related Art

An organic light-emitting device (OLED) is a light-emitting device in which a light-emitting layer disposed between opposite electrodes is made of a thin organic compound. In the OLED, when electrons injected from one electrode and holes injected from the other electrode are recombined with each other in the light-emitting layer, electric current flows through a fluorescent or phosphorescent organic compound of the light-emitting layer to generate light. The organic light-emitting device is more susceptible to moisture than other electronic devices are. Luminous properties thereof are significantly reduced due to oxidation of the electrodes or denaturation of the organic material due to moisture and impurities penetrating into the organic light-emitting device. Therefore, in order to solve this problem, a scheme for encapsulating the organic light-emitting device with a composition for an encapsulant with excellent moisture-proof(hygroscopicity) and excellent optical properties has been employed.

The organic light-emitting device is classified into two types: a bottom emission type and a top emission type, according to a direction in which light emits. In the organic electroluminescent device of the bottom emission type, an aperture ratio (area through which light can be emitted from a unit pixel) is lowered due to an area occupied by a thin film transistor (TFT) circuit, whereas a metal negative electrode may be employed and it does not matter whether the hygroscopic agent (getter) is opaque.

On the contrary, in the organic light-emitting device of the top emission type, the aperture ratio is larger compared to that of the device of the bottom emission type, thereby realizing high-resolution display, whereas a transparent cathode is required and an encapsulant that does not use a hygroscopic agent that impairs optical properties is required, so that there is a limitation on a material that may be applied thereto. Therefore, an encapsulant composition used in the organic electroluminescent device of the top emission type includes a liquid encapsulation composition applied using a dam and fill encapsulation scheme in which a dam material is disposed at an edge of the organic electroluminescent device to form a barrier and an inner region inwardly of the dam is filled with a fill material.

Recently, as applications of the organic electroluminescent device are diversified, the hygroscopicity, optical properties (transparency) and storage stability of the composition for the encapsulant should be further improved. Furthermore, the encapsulant should be produced at a low temperature and at a fast curing speed.

SUMMARY

A purpose of the present disclosure is to provide a thermosetting liquid composition used as an encapsulant of the organic light-emitting device, wherein the composition does not include a physical and chemical hygroscopic agent (getter), has superior hygroscopicity and storage stability compared to that of the prior art, and at the same time, has excellent optical properties, and may be prepared at a low temperature at a fast curing rate.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

One aspect of the present disclosure provides a thermosetting liquid composition for an encapsulant of an organic light-emitting device, the composition comprising: a binder material including an aliphatic 4-functionalized epoxy-based compound; and a cationic thermal-curing initiator.

In one implementation of the thermosetting liquid composition, the binder material further includes an alicyclic 2-functionalized epoxy-based compound, wherein the binder material contains the aliphatic 4-functionalized epoxy-based compound in an amount of 60 or greater parts by weight based on 100 parts by weight of the binder material, and contains the alicyclic 2-functionalized epoxy-based compound in an amount of 40 or smaller parts by weight based on 100 parts by weight of the binder material.

In one implementation of the thermosetting liquid composition, the aliphatic 4-functionalized epoxy-based compound includes at least one selected from a group consisting of sorbitol polyglycidyl ether; trimethylolpropane triglycidyl ether; polyglycerol polyglycidyl ether; and pentaerythritol glycidyl ether.

In one implementation of the thermosetting liquid composition, the aliphatic 4-functionalized epoxy-based compound includes pentaerythritol glycidyl ether.

In one implementation of the thermosetting liquid composition, the alicyclic 2-functionalized epoxy-based compound includes at least one selected from a group consisting of bis(3,4-epoxycyclohexyl)oxalate; bis(3,4-epoxycyclohexylmethyl)adipate; bis(3,4-epoxy-6-methylcyclohexylmethyl)adipate; 3,4-epoxycyclohexylmethyl(3,4-epoxy)cyclohexanecarboxylate; 3,4-epoxycyclohexancarboxylate; 6-methyl-3,4-epoxycyclohexylmethyl(6-methyl-3,4-epoxy)cyclohexanecarboxylate; 3,4-epoxy-2-methylcyclohexylmethyl(3,4-epoxy-2-methyl)cyclohexanecarboxylate; 3,4-epoxy-3-methylcyclohexylmethyl(3,4-epoxy-3-methyl)cyclohexanecarboxylate; 3,4-epoxy-5-methylcyclohexylmethyl(3,4-epoxy-5-methyl)cyclohexanecarboxylate; 3,4-epoxycyclohexylmethyl-3',4'- epoxycyclohexanecarboxylate modified epsilon-caprolactone; and (3',4'-epoxycyclohexane)methyl 3,4-epoxycyclohexylcarboxylate.

In one implementation of the thermosetting liquid composition, the alicyclic 2-functionalized epoxy-based compound includes bis(3,4-epoxycyclohexylmethyl)adipate.

In one implementation of the thermosetting liquid composition, the cationic thermal-curing initiator includes a quaternary ammonium salt cationic compound.

In one implementation of the thermosetting liquid composition, the cationic thermal-curing initiator includes at least one selected from a group consisting of dimethylphenyl (4-methoxybenzyl) ammonium hexafluoro phosphate; dimethylphenyl(4-methoxybenzyl) ammonium hexafluoro antimonate; dimethylphenyl(4-methoxybenzyl) ammonium tetrakis(pentafluoro phenyl) borate; dimethylphenyl (4-methyl benzyl) ammonium hexafluoro hexafluoro phosphate; dimethylphenyl(4-methyl benzyl) ammonium hexafluoro antimonate; dimethylphenyl(4-methyl benzyl) ammonium hexafluoro tetrakis(pentafluorophenyl) borate; methyl phenyl dibenzyl ammonium; methyl phenyl dibenzyl ammonium hexafluoro antimonate hexafluoro phosphate; methyl phenyl dibenzyl ammonium tetrakis(pentafluoro phenyl) borate; phenyltribenzyl ammonium tetrakis(pentafluoro phenyl) borate; dimethylphenyl(3,4-dimethylbenzyl)ammonium tetrakis(pentafluorophenyl) borate; N,N-diethyl-N-benzyl anilinium boron tetrafluoride; and N,N-diethyl-N-benzylpyridinium trifluoromethane sulfonic acid.

In one implementation of the thermosetting liquid composition, the composition further comprises a surfactant.

In one implementation of the thermosetting liquid composition, the surfactant includes a copolymer of polyether-siloxane.

In one implementation of the thermosetting liquid composition, the composition further comprises a temporal stabilizer.

In one implementation of the thermosetting liquid composition, the composition is used as a fill material for dam and fill encapsulation.

In one implementation of the thermosetting liquid composition, the composition is thermally cured to form an optically transparent resin (OCR).

Another aspect of the present disclosure provides an encapsulant for an organic light-emitting device obtained by thermally curing the thermosetting liquid composition as defined above.

In one implementation of the encapsulant, light transmittance of the encapsulant is 99.0% or greater, and haze of the encapsulant is 0.10% or smaller.

The thermosetting liquid composition for the encapsulant of the organic light-emitting device according to the present disclosure is free of the physical and chemical hygroscopic agent but has excellent hygroscopicity. Thus, when the composition is used as the encapsulant of the organic light-emitting device, the composition may effectively block the moisture and suppress moisture permeation, such that the lifespan and durability of the organic light-emitting device may be significantly improved.

Further, the thermosetting liquid composition for the encapsulant of the organic light-emitting device according to the present disclosure has excellent storage stability, and thus has low viscosity change even during long-term storage. At the same time, when the composition is used as the encapsulant of the organic light-emitting device, the encapsulant has low haze and high light transmittance, and thus may have excellent optical properties (transparency) which the organic light-emitting device requires.

Further, the thermosetting liquid composition for the encapsulant for the organic light-emitting device in accordance with the present disclosure may be thermally cured at a low temperature at a rapid manner and thus may be converted into the encapsulant for the organic light-emitting device.

The effects of the present disclosure are not limited to the above-mentioned effects, and further effects as not mentioned will be appreciated by those skilled in the art from following descriptions. In addition to the above-described effects, specific effects of the present disclosure will be described together while describing specific details to carry out the present disclosure below.

DETAILED DESCRIPTIONS

Advantages and features of the present disclosure, and a method of achieving the advantages and features will become apparent with reference to embodiments described later in detail. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A thermosetting liquid composition for an encapsulant of the organic light-emitting device according to one aspect of the present disclosure includes a binder material including an aliphatic 4-functionalized epoxy-based compound; and a cation initiator. In accordance with the present disclosure, the binder material may include an epoxy resin material exhibiting hygroscopicity, and at the same time, participating in a thermal-curing reaction behavior, and may act as a main resin occupying a substantial content of a total amount of the composition.

The binder material according to the present disclosure is free of a physical and chemical hygroscopic agent generally used for an encapsulant for the organic light-emitting device, but includes an aliphatic 4-functionalized epoxy-based compound with high hygroscopicity ability. Thus, when the binder material according to the present disclosure is used for the encapsulant for the organic light-emitting device, the binder material may block moisture and at the same time, effectively suppress moisture permeation, and thus may have excellent moisture absorption and irreversible moisture absorption. Further, since the thermosetting liquid composition for the encapsulant of the organic light-emitting device in accordance with the present disclosure does not include the hygroscopic agent such as an inorganic material as conventionally used, the thermosetting liquid composition for the encapsulant of the organic light-emitting device may have excellent optical properties such as light transmittance and haze, and thus may be applied to the organic light-emitting device. In particular, the thermosetting liquid composition for the encapsulant of the organic light-emitting device in accordance with the present disclosure may be suitably used as an encapsulant of a top-emission type organic light-emitting device that requires excellent transparency.

The binder material of the thermosetting liquid composition for the encapsulant of the organic light-emitting device according to one aspect of the present disclosure is characterized by including an aliphatic 4-functionalized epoxy-based compound with high hygroscopicity. Optionally, an alicyclic 2-functionalized epoxy-based compound may be further incorporated in the binder material. The hygroscopicity tends to decrease as a content of the alicyclic 2-functionalized epoxy-based compound increases. Thus, in order to implement excellent hygroscopicity, when a total amount of the binder material is 100 parts by weight, it is preferable that the binder material contains 60 parts by weight or greater of the aliphatic 4-functionalized epoxy-based compound, and contains 40 parts by weight or smaller of the alicyclic 2-functionalized epoxy-based compound.

The aliphatic 4-functionalized epoxy-based compound which may be used in accordance with the present disclosure exhibits high hygroscopicity. For example, the aliphatic 4-functionalized epoxy-based compound may include at least one selected from a group consisting of sorbitol polyglycidyl ether; trimethylolpropane triglycidyl ether; polyglycerol polyglycidyl ether; and pentaerythritol glycidyl ether, and may preferably include pentaerythritol glycidyl ether (PETG) having a following chemical structure:

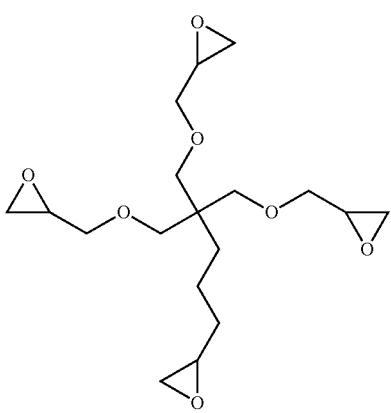 [SMILES: C(CC1CO1)CC(COCC1CO1)(COCC1CO1)COCC1CO1]

pentaerythritol glycidyl ether; PETG

The alicyclic 2-functionalized epoxy-based compound that may be used in accordance with the present disclosure may include, for example, at least one selected from a group consisting of bis(3,4-epoxycyclohexyl)oxalate; bis(3,4-epoxycyclohexylmethyl)adipate; bis(3,4-epoxy-6-methylcyclohexylmethyl)adipate; 3,4-epoxycyclohexylmethyl(3,4-epoxy)cyclohexanecarboxylate; 3,4-epoxycyclohexanecarboxylate; 6-methyl-3,4-epoxycyclohexylmethyl(6-methyl-3,4-epoxy) cyclohexanecarboxylate; 3,4-epoxy-2-methylcyclohexylmethyl(3,4-epoxy-2-methyl) cyclohexanecarboxylate; 3,4-epoxy-3-methylcyclohexylmethyl(3,4-epoxy-3-methyl) cyclohexanecarboxylate; 3,4-epoxy-5-methylcyclohexylmethyl(3,4-epoxy-5-methyl) cyclohexanecarboxylate; 3,4-epoxycyclohexylmethyl-3',4'-epoxycyclohexanecarboxylate modified epsilon-caprolactone; and (3',4'-epoxycyclohexane)methyl 3,4-epoxycyclohexylcarboxylate.

Further, the thermosetting liquid composition for the encapsulant of the organic light-emitting device in accordance with the present disclosure may further include a cationic thermal-curing initiator in addition to the binder material including the aliphatic 4-functionalized epoxy-based compound and the alicyclic 2-functionalized epoxy-based compound.

Further, the thermosetting liquid composition for the encapsulant of the organic light-emitting device in accordance with the present disclosure may further include a temporal stabilizer.

Further, the thermosetting liquid composition for the encapsulant of the organic light-emitting device in accordance with the present disclosure may further include a surfactant.

Hereinafter, the components included in the thermosetting liquid composition for the encapsulant of the organic light-emitting device according to the present disclosure other than the epoxy binder as described above will be described.

Cationic Thermal-Curing Initiator

The cationic thermal-curing initiator according to the present disclosure is an additive for accelerating a polymerization reaction of the epoxy binder material and, further, for improving storage stability and achieving complete curing under a curing condition. The cationic thermal-curing initiator according to the present disclosure may include a quaternary ammonium salt cationic compound. Specifically, a cationic portion of the cationic thermal-curing initiator may be a quaternary ammonium salt, and an anionic portion thereof may be phosphate, antimonate, borate, sulfonate, or the like. For example, the cationic thermal-curing initiator may include, for example, at least one selected from a group consisting of dimethylphenyl(4-methoxybenzyl) ammonium hexafluoro phosphate; dimethylphenyl(4-methoxybenzyl) ammonium hexafluoro antimonate; dimethylphenyl(4-methoxybenzyl) ammonium tetrakis(pentafluoro phenyl) borate; dimethylphenyl (4-methyl benzyl) ammonium hexafluoro phosphate; dimethylphenyl(4-methyl benzyl) ammonium hexafluoro antimonate; dimethylphenyl (4-methyl benzyl) ammonium hexafluoro tetrakis(pentafluorophenyl) borate; methyl phenyl dibenzyl ammonium; methyl phenyl dibenzyl ammonium hexafluoro antimonate hexafluoro phosphate; methyl phenyl dibenzyl ammonium tetrakis(pentafluoro phenyl) borate; phenyltribenzyl ammonium tetrakis(pentafluoro phenyl) borate; dimethylphenyl(3,4-dimethylbenzyl)ammonium tetrakis(pentafluorophenyl) borate; N,N-diethyl-N-benzyl anilinium boron tetrafluoride; and N,N-diethyl-N-benzylpyridinium trifluoromethane sulfonic acid. However, the present disclosure is not limited thereto.

It is preferable that the composition contains 2.0 to 2.5 parts by weight of the cationic thermal-curing initiator relative to 100 parts by weight of the binder material. When a content of the cationic thermal-curing initiator is smaller than 2.0 parts by weight, curing is not sufficiently carried out under the curing condition, so that an uncured portion may be produced. On the contrary, when the content thereof is larger than 2.5 parts by weight, there may be a problem in that the storage stability is rather deteriorated.

Temporal Stabilizer

The temporal stabilizer according to the present disclosure is an additive for suppressing temporal change in the liquid composition (preventing viscosity increase) under an environment (25 to 40° C.) below a curing temperature, thereby improving storage stability of the composition. The temporal stabilizer according to the present disclosure may be used without limitation as long as it is used in the epoxy binder material so as to achieve an effect of suppressing the viscosity increase. For example, the temporal stabilizer according to the present disclosure may include at least one selected from a group consisting of amide carboxylate, trimethylborate, triethylborate, tri n-propylborate, triisopropylborate, tri n-butylborate, trioctadecylborate, tris(2-ethylhexyloxy)borane, bis(1,4,7,10-tetraoxaundecyl) (1,4,7,10,13-pentaoxatetradecyl) (1,4,7-tri oxaundecyl)borane, tribenzyl borate, ethyl phosphate, butyl phosphate, phosphate-di(2-ethylhexyl) and ethyldiethyl phosphate. However, the present disclosure is not limited thereto.

It is preferable that the composition contains 0.1 to 1.0 parts by weight of the temporal stabilizer relative to 100 parts by weight of the epoxy-based binder material. When a content of the temporal stabilizer is smaller than 0.1 parts by weight, the storage stability is not sufficiently ensured. On the contrary, when the content thereof is in excess of 1.0 parts by weight, curing is not sufficiently carried out under the curing condition, and thus an uncured portion may be produced.

Surfactant

The surfactant according to the present disclosure is an additive for controlling spreadability and a surface tension of a resin formed by curing the composition for the encapsulant when the encapsulant is applied on a glass of the organic light-emitting device.

The surfactant according to the present disclosure is preferably a surfactant containing silicone, and preferably, a copolymer of polyether siloxane. For example, the surfactant according to the present disclosure may include at least one selected from a group consisting of WET-270, WET-500, Rad-2100, Rad-2011, Glide-100, Glide-410, Glide-450, and Flow-425 commercially available from Evonik Industries, and BYK-306, BYK-307, BYK-310, BYK-320, BYK-330, BYK-331, BYK-333, BYK-342, BYK-350, BYK-354, BYK-355, BYK-3550, BYK-356, BYK-358N, BYK-359, BYK-361N, BYK-381, BYK-370, BYK-371, BYK-378, BYK-388, BYK-392, BYK-394, BYK-399, BYK-3440, and BYK-3441 commercially available from BYK company.

It is preferable for the composition to contain 0.1 to 1.0 parts by weight of the surfactant based on 100 parts by weight of the epoxy-based binder material. When a content of the surfactant is smaller than 0.1 parts by weight, a surface tension increases excessively, such that when the encapsulant is applied to the device, the spreadability of the resin decreases. To the contrary, when the content thereof is excess of 1.0 parts by weight, the surface tension decreases too much, resulting in an overflow of the resin.

According to one aspect according to the present disclosure, the thermosetting liquid composition for the encapsulant of the organic light-emitting device may be thermally cured to produce the encapsulant of the organic light-emitting device. In this regard, light transmittance of the encapsulant is 99.0% or higher, and a haze thereof is 0.10% or smaller and, thus, excellent optical properties is achieved.

The thermosetting liquid composition for the encapsulant of the organic light-emitting device according to the present disclosure as described above may be used as a fill material for dam and fill encapsulation, and may be subjected to thermal curing and thus may act as an optically transparent resin (OCR).

Hereinafter, a configuration and an effect of the present disclosure will be described in more detail based on preferred Examples of the present disclosure. However, those are presented as implementations of the present disclosure and should not be construed as limiting the present disclosure in any sense. Since contents as not described herein may be technically inferred sufficiently by those skilled in the art, descriptions thereof will be omitted.

PRESENT EXAMPLE 1

An uncured liquid mixture composition was prepared by mixing 2.0 parts by weight of a cationic thermal-curing initiator with 100 parts by weight of PETG as an epoxy binder, as shown in Table 1 below.

PRESENT EXAMPLES 2 TO 5

An uncured liquid mixture composition was prepared in the same manner as in Present Example 1, except that in each of Present Examples 2 to 5, an alicyclic 2-functionalized epoxy-based compound, a temporal stabilizer and a surfactant were further added to the epoxy binder PETG, and the cationic thermal-curing initiator, and that in each of Present Examples 4 to 5, a content of the cationic thermal-curing initiator was changed to 2.1 parts by weight. Components and contents thereof of the liquid mixture composition of each of Present Examples 1 to 5 are shown in Table 1 below.

COMPARATIVE EXAMPLES 1 TO 5

An uncured liquid mixture composition was prepared in the same manner as in Present Example 2, except that in Comparative Example 1, 40 parts by weight of PETG was contained and 60 parts by weight of the alicyclic 2-functionalized epoxy-based compound was contained.

An uncured liquid mixture composition was prepared in Comparative Example 2 in which an alicyclic 2-functionalized epoxy-based compound was used while PETG is excluded.

In each of Comparative Examples 3 to 5, PETG was excluded while the alicyclic 2-functionalized epoxy-based compound was contained. Further, in Comparative Examples 3 to 5, magnesium oxide (MgO, average particle diameter 20 nm), porous silicon dioxide, and zeolite (average particle diameter 50 nm) were used as the hygroscopic agent material, respectively. Further, in each of Comparative Examples 3 and 4, a small amount of a dispersing agent to improve dispersibility was further added.

Components and contents thereof of the liquid mixture composition of each of Comparative Examples 1 to 5 are shown in Table 2 below.

Experimental Example 1: Evaluation of Hygroscopicity

The hygroscopicity was evaluated as a weight change when moisture was added to the liquid mixture composition obtained in Present Example 1. A weight change after a reliability test in high temperature and high humidity conditions and a weight change after a high temperature heat treatment following the reliability test were calculated. A specific evaluation method and a weight change calculation method are as follows.

A bare glass to be placed at a bottom (hereafter "bottom glass") was prepared and a weight thereof was measured (which was recorded as "Weight ①"). 0.5 g of the liquid mixture composition obtained in Present Example 1 was applied to a center of the prepared bottom glass, and then a stack of two release films was placed at ends of four sides of the bottom glass so as to form a step. A further glass (hereinafter, "top glass") having a release film attached thereto was disposed on the bottom glass. In this state, thermal curing was performed for 1 hour at 100° C./1 hr in a high-temperature oven.

After the thermal-curing was completed, the top glass and the stack of the release films to form the step were removed therefrom to prepare a sample having the bottom glass and a cured resin formed thereon. Then, a weight of the sample was measured (which was recorded as "Weight ②").

For high-temperature and high-humidity reliability evaluation, the sample was input into a chamber under a 85° C./85% RH condition, and was taken out of the chamber after 100 hours. Then, the sample was maintained at room temperature (about 25° C.) for 1 hour, and then a weight of the sample after the reliability evaluation was measured (which was recorded as "Weight ③").

After the reliability evaluation, the sample was placed on a hot plate heated to 90° C. and was maintained thereon for 1 hour, and then was left at room temperature (about 25° C.) for 1 hour. Then, a weight of the sample was measured (which was recorded as "Weight ④").

Weight change after reliability
    evaluation=[(③-①)-(②-①)]/(②-①)×100%(Equation 1)

Weight change after reliability evaluation and high
    temperature
    treatment=[(④-①)-(②-①)]/(②-①)×100% (Equation 2)

When the weight change according to Equation 1 was 3% or greater, and the weight change according to Equation 2 was 3% or greater, the hygroscopicity was evaluated to be excellent.

The method and the calculation of Experimental Example 1 were repeatedly performed on each of Present Examples 2 to 5 and Comparative Examples 1 to 5, and results thereof are shown in Tables 1 and 2 below.

Experimental Example 2: Measurement of Transmittance and Haze

An alkali-free glass was prepared. 0.1 g of the liquid mixture composition obtained in Present Example 1 was applied thereon, and then another alkali-free glass was laminated thereon. In the laminated state, thermal curing was performed in a high temperature oven at 100° C./1 hr for 1 hour to prepare a sample. The sample was placed in a haze meter equipment (NDH-7000), and then light transmittance and haze were simultaneously measured using a ASTM D 1003 measurement method.

The measurements of Experimental Example 2 were performed repeatedly on each of Present Examples 2 to 5 and Comparative Examples 1 to 5, and the results thereof are shown in Tables 1 and 2 below.

Experimental Example 3: Measurement of Storage Stability

Storage stability was evaluated as change in viscosity on a daily basis after storage at 40° C. relative to an initial viscosity. For measuring the viscosity, Cone & plate viscometer equipment commercially available from Brookfield company was set to a following condition, and the liquid mixture composition obtained in Present Example 1 was applied to a sample cup and then the viscosity thereof was checked and recorded using the equipment.

VISCOSITY MEASUREMENT CONDITION

Temperature: 25° C.
Speed: 10 rpm
Sample input amount: 0.5 ml (Torque: 30 to 60%)

The viscosity change was calculated according to a following Equation 3:

Viscosity change (%)=(viscosity after 7 days-initial viscosity)/initial viscosity×100%     (Equation 3)

When the viscosity change according to Equation 3 was within 10%, the sample was evaluated as having excellent storage stability.

The measurements and calculations of Experimental Example 3 were repeatedly performed on each of Present Examples 2 to 5 and Comparative Examples 1 to 5, and results thereof are shown in Tables 1 and 2 below.

TABLE 1

| | | | | | Present Example 1 | Present Example 2 | Present Example 3 | Present Example 4 | Present Example 5 |
|---|---|---|---|---|---|---|---|---|---|
| Composition | Alicyclic 2-functionalized epoxy-based compound | A | | Parts by weight | | 40.0 | 35.0 | 40.0 | 35.0 |
| | | B | | Parts by weight | | | | | |
| | Aliphatic 4-functionalized epoxy-based compound | PETG | | Parts by weight | 100.0 | 60.0 | 65.0 | 60.0 | 65.0 |
| | Physical/chemical hygroscopic agent | | | Parts by weight | | | | | |
| | Cationic initiator | C | | Parts by weight | 2.0 | 2.0 | 2.0 | 2.1 | 2.1 |
| | Temporal stabilizer | D | | Parts by weight | | 0.5 | 0.5 | 0.5 | 0.5 |
| | Surfactant | WET-270 | | Parts by weight | | 0.1 | 0.1 | 0.1 | 0.1 |
| | Dispersant | D510 | | Parts by weight | | | | | |
| Properties | Hygroscopic ability (weight change) | After high temperature/high humidity | | % | 8.7 | 6.1 | 6.6 | 5.8 | 6.2 |
| | | After high temperature heat treatment | | % | 4.5 | 3.2 | 3.5 | 3.1 | 3.2 |
| | Optical properties | Transmittance | | % | 99.9 | 99.9 | 99.9 | 99.9 | 99.9 |
| | | Haze | | % | 0.01 | 0.00 | 0.02 | 0.01 | 0.00 |
| | Storage stability | @ 40° C. | | Days | >7 days | >7 days | >7 days | >7 days | >7 days |

TABLE 2

|  |  |  | | Comparative Example 1 | Comparative Example 2 | Comparative Example 3 | Comparative Example 4 | Comparative Example 5 |
|---|---|---|---|---|---|---|---|---|
| Composition | Alicyclic 2-functionalized epoxy-based compound | A | Parts by weight | 60.0 | 50.0 | 50.0 | | |
| | | B | Parts by weight | | 50.0 | 50.0 | 100.0 | 100.0 |
| | Aliphatic 4-functionalized epoxy-based compound | PETG | Parts by weight | 40.0 | | | | |
| | Physical/chemical hygroscopic agent | | Parts by weight | — | — | 5.0 | 4.0 | 4.0 |
| | Cationic initiator | C | Parts by weight | 2.0 | 0.7 | 0.5 | 1.0 | 3.0 |
| | temporal stabilizer | D | Parts by weight | 0.5 | 0.5 | 0.5 | 0.5 | |
| | Surfactant | WET-270 | Parts by weight | 0.1 | | | | |
| | Dispersant | D510 | Parts by weight | | | 0.075 | 0.4 | |
| Properties | Hygroscopic ability (weight change) | After high temperature/high humidity | % | 4.1 | 2.4 | 0.0 | 3.9 | 0.0 |
| | | After high temperature heat treatment | % | 2.1 | 0.7 | −0.2 | 3.3 | −0.4 |
| | Optical properties | Transmittance | % | 99.9 | 99.9 | <95 | 99.8 | 96.5 |
| | | Haze | % | 0.00 | 0.01 | >10.0 | 0.73 | 6.16 |
| | Storage stability | @ 40° C. | Days | <7 days | >7 days | Particle precipitation | >7 days | Particle precipitation |

The components listed in Table 1 and Table 2 are as follows.

A: bis(3,4-epoxycyclohexylmethyl)adipate

B: 3,4-epoxycyclohexylmethyl-3',4'-epoxycyclohexanecarboxylate modified epsilon-caprolactone C: quaternary ammonium salt having tetrakis(pentafluorophenyl borate) as an anion (King Industries, CXC-1821)

D: amide carboxylate

WET-270 : Polyether-siloxane copolymer having a following structure:

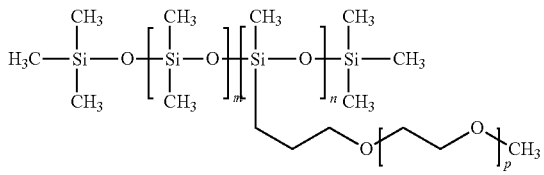

D510: Solplus™ from Lubrizol company

The present disclosure is not limited to the embodiments disclosed in the present disclosure, and various modifications may be made by those skilled in the art. In addition, even when effects according to configurations of the present disclosure were not explicitly described above while describing the embodiments of the present disclosure, the effects predictable from the configurations should be acknowledged.

What is claimed is:

1. A thermosetting liquid composition for an encapsulant of an organic light-emitting device, the composition comprising:
a binder material including an aliphatic 4-functionalized epoxy-based compound in an amount of 60 or greater parts by weight and less than 100 parts by weight based on 100 parts by weight of the binder material, and an alicyclic 2-functionalized epoxy-based compound in an amount of more than 0 parts by weight and 40 or smaller parts by weight based on 100 parts by weight of the binder material; and
a cationic thermal-curing initiator;
wherein the aliphatic 4-functionalized epoxy-based compound is pentaerythritol glycidyl ether; and
wherein the alicyclic 2-functionalized epoxy-based compound is bis (3,4-epoxycyclohexylmethyl)adipate.

2. The thermosetting liquid composition of claim 1, wherein the cationic thermal-curing initiator includes a quaternary ammonium salt cationic compound.

3. The thermosetting liquid composition of claim 1, wherein the cationic thermal-curing initiator includes at least one selected from a group consisting of dimethylphenyl(4-methoxybenzyl) ammonium hexafluoro phosphate; dimethylphenyl(4-methoxybenzyl) ammonium hexafluoro antimonate; dimethylphenyl(4-methoxybenzyl) ammonium tetrakis(pentafluoro phenyl) borate; dimethylphenyl (4-methyl benzyl) ammonium hexafluoro hexafluoro phosphate; dimethylphenyl(4-methyl benzyl) ammonium hexafluoro antimonate; dimethylphenyl(4-methyl benzyl) ammonium hexafluoro tetrakis(pentafluorophenyl) borate; methyl phenyl dibenzyl ammonium; methyl phenyl dibenzyl ammonium hexafluoro antimonate hexafluoro phosphate; methyl phenyl dibenzyl ammonium tetrakis(pentafluoro phenyl) borate; phenyltribenzyl ammonium tetrakis(pentafluoro phenyl) borate; dimethylphenyl(3,4-dimethylbenzyl)ammonium tetrakis(pentafluorophenyl) borate; N,N-diethyl-N-benzyl anilinium boron tetrafluoride; and N,N-diethyl-N-benzylpyridinium trifluoromethane sulfonic acid.

4. The thermosetting liquid composition of claim 1, wherein the composition further comprises a surfactant.

5. The thermosetting liquid composition of claim 4, wherein the surfactant includes a copolymer of polyether-siloxane.

6. The thermosetting liquid composition of claim 1, wherein the composition further comprises a temporal stabilizer including at least one temporal stabilizer selected from the group consisting of amide carboxylate, trimethylborate, triethylborate, tri n-propylborate, triisopropylborate, tri n-butylborate, trioctadecylborate, tris (2-ethylhexyloxy) borane, bis(1,4,7,10-tetraoxaundecyl) (1,4,7,10,13-pentaoxatetradecyl) (1,4,7-tri oxaundecyl)borane, tribenzyl borate, ethyl phosphate, butyl phosphate, phosphate-di(2-ethylhexyl) and ethyldiethyl phosphate.

7. The thermosetting liquid composition of claim 1, wherein the composition is used as a fill material for dam and fill encapsulation.

8. The thermosetting liquid composition of claim 1, wherein the composition is thermally cured to form an optically transparent resin.

9. An encapsulant for an organic light-emitting device obtained by thermally curing the thermosetting liquid composition according to claim 1.

10. The encapsulant of claim 9, wherein light transmittance of the encapsulant is 99.0% or greater, and haze of the encapsulant is 0.10% or smaller.

\* \* \* \* \*